(12) United States Patent
Jung

(10) Patent No.: US 10,038,432 B2
(45) Date of Patent: Jul. 31, 2018

(54) DUTY CORRECTION CIRCUIT

(71) Applicant: SK hynix Inc., Icheon-si, Gyeonggi-do (KR)

(72) Inventor: In Hwa Jung, Icheon-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 63 days.

(21) Appl. No.: 15/138,422

(22) Filed: Apr. 26, 2016

(65) Prior Publication Data

US 2017/0230040 A1    Aug. 10, 2017

(30) Foreign Application Priority Data

Feb. 5, 2016    (KR) .................. 10-2016-0014924

(51) Int. Cl.
*H03K 3/017*    (2006.01)
*H03K 5/156*    (2006.01)
*H03K 5/14*    (2014.01)
*H03K 5/1534*    (2006.01)
*H03K 5/00*    (2006.01)

(52) U.S. Cl.
CPC .............. *H03K 5/1565* (2013.01); *H03K 5/14* (2013.01); *H03K 5/1534* (2013.01); *H03K 2005/00234* (2013.01)

(58) Field of Classification Search
None
See application file for complete search history.

(56) References Cited

U.S. PATENT DOCUMENTS

| 7,180,346 | B2 * | 2/2007 | Lee | H03K 5/1565 |
| | | | | 327/172 |
| 9,118,311 | B1 * | 8/2015 | Lancaster | H03K 5/159 |
| 2012/0280733 | A1 * | 11/2012 | Zhu | H03K 5/1565 |
| | | | | 327/175 |
| 2013/0257499 | A1 * | 10/2013 | Wang | H03K 5/1565 |
| | | | | 327/175 |
| 2014/0002147 | A1 * | 1/2014 | Yasukawa | H03K 3/011 |
| | | | | 327/113 |
| 2014/0118044 | A1 * | 5/2014 | Liu | H03K 5/1565 |
| | | | | 327/175 |
| 2015/0236679 | A1 * | 8/2015 | Tamura | H03K 19/0008 |
| | | | | 327/175 |
| 2015/0349787 | A1 * | 12/2015 | Keil | H03K 5/1534 |
| | | | | 327/145 |

FOREIGN PATENT DOCUMENTS

KR    1020090048885 A    5/2009

* cited by examiner

*Primary Examiner* — Lincoln Donovan
*Assistant Examiner* — Khareem E Almo
(74) *Attorney, Agent, or Firm* — William Park & Associates Ltd.

(57) ABSTRACT

A duty correction circuit may be provided. The duty correction circuit may include a control circuit configured to generate a duty correction control signal by detecting edges of first and second differential clock signals. The duty a duty correction clock signal generation circuit may be configured to generate a duty correction clock signal according to edges of the duty correction control signal.

18 Claims, 6 Drawing Sheets

DUTY CORRECTION CIRCUIT

CROSS-REFERENCES TO RELATED APPLICATION

The present application claims priority under 35 U.S.C. § 119(a) to Korean application number 10-2016-0014924, filed on Feb. 5, 2016, in the Korean Intellectual Property Office, which is incorporated herein by reference in its entirety.

BACKGROUND

1. Technical Field

Various embodiments generally relate to a semiconductor circuit, and more particularly, to a duty correction circuit.

2. Related Art

With reference to semiconductor circuit technology, a clock signal is used as a reference signal for adjusting operation timings in a system or circuit. When a clock signal received from outside a circuit or system is used in the circuit or system, a time delay is inevitably caused by an internal circuit.

A semiconductor device, for example, a semiconductor memory device requires an internal clock signal having the same phase as the external clock signal and this is obtained through an operation of correcting such a time delay.

In order to generate the internal clock signal having the same phase as the external clock signal, a DLL (Delay Locked Loop) or PLL (Phase Locked Loop) circuit is embedded in the semiconductor device.

Furthermore, when a duty ratio difference occurs or a ratio of a high-level period to a low-level period has a different value from a desired ratio (for example, 50:50) even though a phase difference is corrected by the DLL or PLL circuit, an operation timing margin of the corresponding semiconductor device may be reduced, causing degradation in the performance.

Thus, the semiconductor device may include a duty correction circuit for correcting the duty ratio of a clock signal.

SUMMARY

In an embodiment, a duty correction circuit may be provided. The duty correction circuit may include a control circuit configured to generate a duty correction control signal by detecting edges of first and second differential clock signals. The duty correction circuit may include a duty correction clock signal generation circuit configured to generate a duty correction clock signal according to edges of the duty correction control signal.

In an embodiment, a duty correction circuit may be provided. The duty correction circuit may include a control circuit configured to generate a duty correction control signal by detecting edges of first and second differential clock signals according to an enable signal. The duty correction circuit may include a duty correction clock signal generation circuit configured to generate a duty correction clock signal according to edges of the enable signal and the duty correction control signal.

In an embodiment, a duty correction circuit may be provided. The duty correction circuit may include an enable control signal generation circuit configured to generate a first enable control signal by sampling an enable signal using a second differential clock signal, and generate a second enable control signal by sampling the first enable control signal using a first differential clock signal. The duty correction circuit may include a duty correction control signal generation circuit configured to generate first pulse signals which correspond to an active period of the first enable control signal and edges of the first differential clock signal, generate second pulse signals which correspond to an active period of the second enable control signal and edges of the second differential clock signal, and output the generated pulse signals as a duty correction control signal. The duty correction circuit may include a duty correction clock signal generation circuit configured to generate a first duty correction clock signal by dividing a first feedback signal based on a first timing of the duty correction control signal, and generate a second duty correction clock signal by dividing a second feedback signal based on a second timing of the duty correction control signal.

DETAILED DESCRIPTION

Various embodiments may be directed to a duty correction circuit which may be capable of suppressing clock characteristic degradation, may have a wide correctable duty range, and may be capable of rapidly performing duty correction.

Hereinafter, a duty correction circuit according to the present disclosure will be described below with reference to the accompanying drawings through examples of embodiments.

Figure 1:
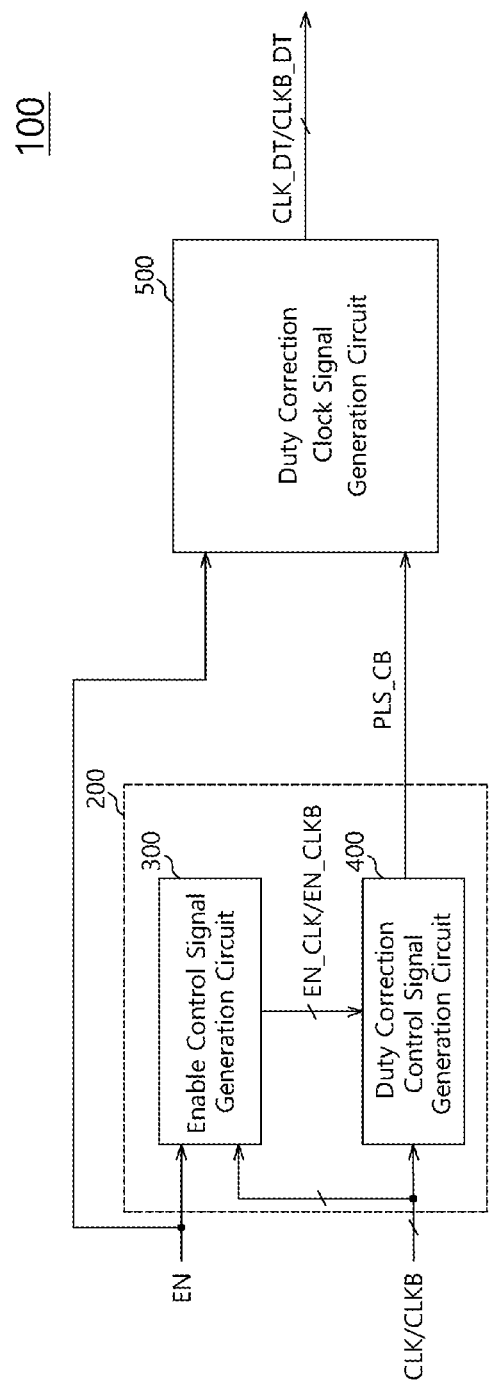
FIG. 1 is a diagram illustrating a representation of an example of the configuration of a duty correction circuit according to an embodiment.

Referring to FIG. 1, the duty correction circuit 100 according to an embodiment may include a control circuit 200 and a duty correction clock signal generation circuit 500.

The control circuit 200 may output a duty correction control signal PLS_CB according to a clock signal, for example, differential clock signals CLK and CLKB and an enable signal EN.

Between the differential clock signals CLK and CLKB, the differential clock signal CLK may be referred to as a first differential clock signal, and the differential clock signal CLKB may be referred to as a second differential clock signal.

The first and second differential clock signals CLK and CLKB may have a predetermined phase difference (for example, 180 degrees).

The control circuit 200 may detect edges of the first and second differential clock signals CLK and CLKB using the enable signal EN, and output pulse signals generated in response to the detected edges as the duty correction control signal PLS_CB.

The control circuit 200 may include an enable control signal generation circuit 300 and a duty correction control signal generation circuit 400.

The enable control signal generation circuit 300 may generate first and second enable control signals EN_CLK and EN_CLKB according to the differential clock signals CLK and CLKB and the enable signal EN.

The enable control signal generation circuit 300 may provide the first and second enable control signals EN_CLK and EN_CLKB using the enable signal EN such that the first and second enable control signals EN_CLK and EN_CLKB correspond to the first and second differential clock signals CLK and CLKB, respectively.

The first enable control signal EN_CLK may be used to detect a rising edge of the first differential clock signal CLK.

The second enable control signal ENB_CLK may be used to detect a rising edge of the second differential clock signal CLKB.

The duty correction control signal generation circuit 400 may generate the duty correction control signal PLS_CB according to the differential clock signals CLK and CLKB and the first and second enable control signals EN_CLK and EN_CLKB.

The duty correction clock signal generation circuit 500 may generate duty correction clock signals CLK_DT and CLKB_DT according to the duty correction control signal PLS_CB and the enable signal EN.

Between the duty correction clock signals CLK_DT and CLKB_DT, the duty correction clock signal CLK_DT may be referred to as a first differential duty correction clock signal, and the duty correction clock signal CLKB_DT may be referred to as a second duty correction clock signal.

The first duty correction clock signal CLK_DT and the second duty correction clock signal CLKB_DT may have a desired duty ratio regardless of a duty ratio difference between input signals or the first and second differential clock signals CLK and CLKB. This configuration will be described below with reference to the rest drawings.

Figure 2:
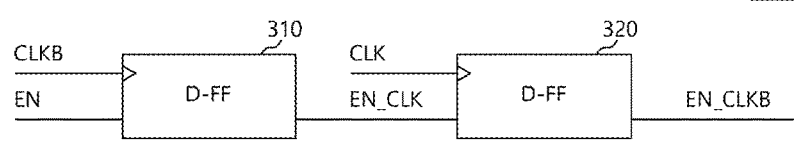
FIG. 2 is a diagram illustrating a representation of an example of the configuration of an enable control signal generation circuit 300 of FIG. 1.

Referring to FIG. 2, the enable control signal generation circuit 300 may generate the first enable control signal EN_CLK by sampling the enable signal EN using the second differential clock signal CLKB, and generate the second enable control signal EN_CLKB by sampling the first enable control signal EN_CLK using the first differential clock signal CLK.

The enable control signal generation circuit 300 may include a first flip-flop (D-FF) 310 and a second flip-flop 320.

The first flip-flop 310 may generate the first enable control signal EN_CLK by sampling the enable signal EN using the second differential clock signal CLKB.

The second flip-flop 320 may generate the second enable control signal EN_CLK by sampling the first enable control signal EN_CLK using the first differential clock signal CLK.

Figure 3:
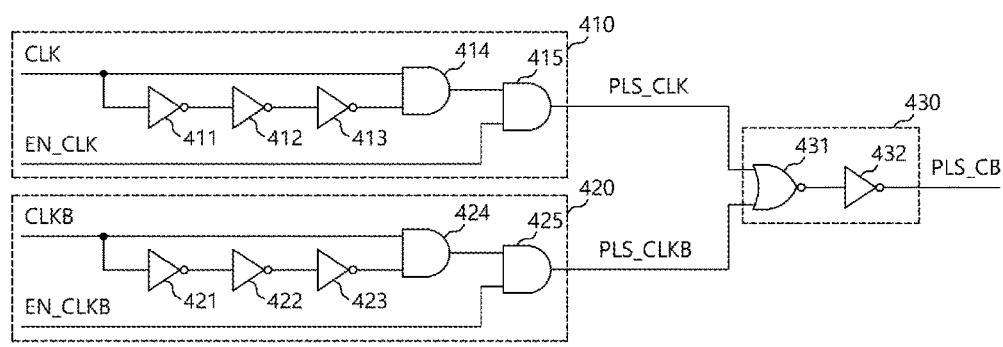
FIG. 3 is a diagram illustrating a representation of an example of the configuration of a duty correction control signal generation circuit 400 of FIG. 1.

Referring to FIG. 3, the duty correction control signal generation circuit 400 may include a first edge detection circuit 410, a second edge detection circuit 420, and a signal combination circuit 430.

The first edge detection circuit 410 may generate pulse signals corresponding to rising edges of the first differential clock signal CLK, and output pulse signals corresponding to an active period of the first enable control signal EN_CLK among the generated pulse signals, as a first pre-duty correction control signal PLS_CLK.

The first edge detection circuit 410 may include first to fifth logic gates 411 to 415.

The first to third logic gates 411 to 413, which are a delay circuit including inverters, may delay the first differential clock signal CLK by a preset time.

The fourth logic gate 414 may perform an AND operation on the first differential clock signal CLK and an output signal of the delay circuit.

The fifth logic gate 415 may perform an AND operation on an output signal of the fourth logic gate 414 and the first enable control signal EN_CLK, and output the first pre-duty correction control signal PLS_CLK.

The second edge detection circuit 420 may generate pulse signals corresponding to rising edges of the second differential clock signal CLKB, and output pulse signals corresponding to an active period of the second enable control signal EN_CLKB among the generated pulse signals, as a second pre-duty correction control signal PLS_CLKB.

The second edge detection circuit 420 may include first to fifth logic gates 421 to 425.

The first to third logic gates 421 to 423, which are a delay circuit including inverters, may delay the second differential clock signal CLKB by a preset time.

The fourth logic gate 424 may perform an AND operation on the second differential clock signal CLKB and an output signal of the delay circuit.

The fifth logic gate 425 may perform an AND operation on an output signal of the fourth logic gate 424 and the second enable control signal EN_CLKB, and output the second pre-duty correction control signal PLS_CLKB.

The signal combination circuit 430 may perform an OR operation on the first pre-duty correction control signal PLS_CLK and the second pre-duty correction control signal PLS_CLKB, and output the operation result as the duty correction control signal PLS_CB.

The signal combination circuit 430 may include, for example, first and second logic gates 431 and 432.

The first logic gate 431 may perform a NOR operation on the first and second pre-duty correction control signals PLS_CLK and PLS_CLKB.

The second logic gate 432 may invert an output signal of the first logic gate 431, and output the inverted signal as the duty correction control signal PLS_CB.

Figure 4:
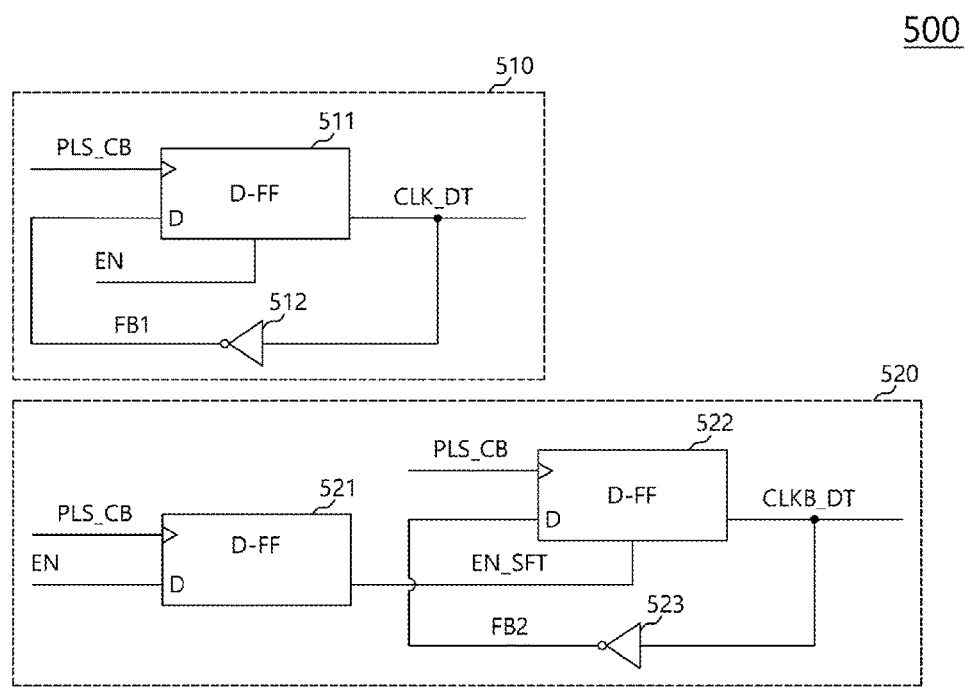
FIG. 4 is a diagram illustrating a representation of an example of the configuration of a duty correction clock signal generation circuit 500 of FIG. 1.

Referring to FIG. 4, the duty correction clock signal generation circuit 500 may include a first duty correction clock signal generation circuit 510 and a second duty correction clock signal generation circuit 520.

The first duty correction clock signal generation circuit 510 may generate the first duty correction clock signal CLK_DT by dividing a feedback signal FB1 based on a first timing of the duty correction control signal PLS_CB.

The first duty correction clock signal generation circuit 510 may change the first duty correction clock signal CLK_DT whenever an edge occurs from the first edge of the duty correction control signal PLS_CB, such that the first duty correction clock signal CLK_DT is generated at a predetermined duty ratio (for example, 50:50).

The first duty correction clock signal generation circuit 510 may perform the operation of generating the first duty correction clock signal CLK_DT during an active period of the enable signal EN.

The first duty correction clock signal generation circuit 510 may include a divider 511 and 512, and the divider 511 and 512 may include a flip-flop 511 and an inverter 512.

When the enable signal EN is activated, the flip-flop 511 may output a signal obtained by latching the feedback signal FB1 as the first duty correction clock signal CLK_DT according to a rising edge of the duty correction control signal PLS_CB.

The inverter 512 may invert the first duty correction clock signal CLK_DT, and provide the inverted signal as the feedback signal FB1 to the flip-flop 511.

The second duty correction clock signal generation circuit 520 may generate the second duty correction clock signal CLKB_DT by dividing a feedback signal FB2 based on a second timing of the duty correction control signal PLS_CB.

The second duty correction clock signal generation circuit 520 may change the second duty correction clock signal CLKB_DT whenever an edge occurs from the second edge of the duty correction control signal PLS_CB, such that the second duty correction clock signal CLKB_DT is generated at the predetermined duty ratio (for example, 50:50).

The second duty correction clock signal generation circuit 520 may include a timing controller 521 and a divider 522 and 523.

The timing controller 521 may include a flip-flop, and generate a shift signal EN_SFT by shifting the enable signal EN based on an edge of the duty correction control signal PLS_CB.

The divider 522 and 523 may include a flip-flop 522 and an inverter 523.

When the shift signal EN_SFT is activated, the flip-flop 522 may output a signal obtained by latching the feedback signal FB2 as the second duty correction clock signal CLKB_DT according to a rising edge of the duty correction control signal PLS_CB.

The inverter 523 may invert the second duty correction clock signal CLKB_DT, and provide the inverted signal as the feedback signal FB2 to the flip-flop 522.

The duty correction operation of the duty correction circuit 100 according to an embodiment will be described with reference to FIGS. 5 and 6.

Figure 5:
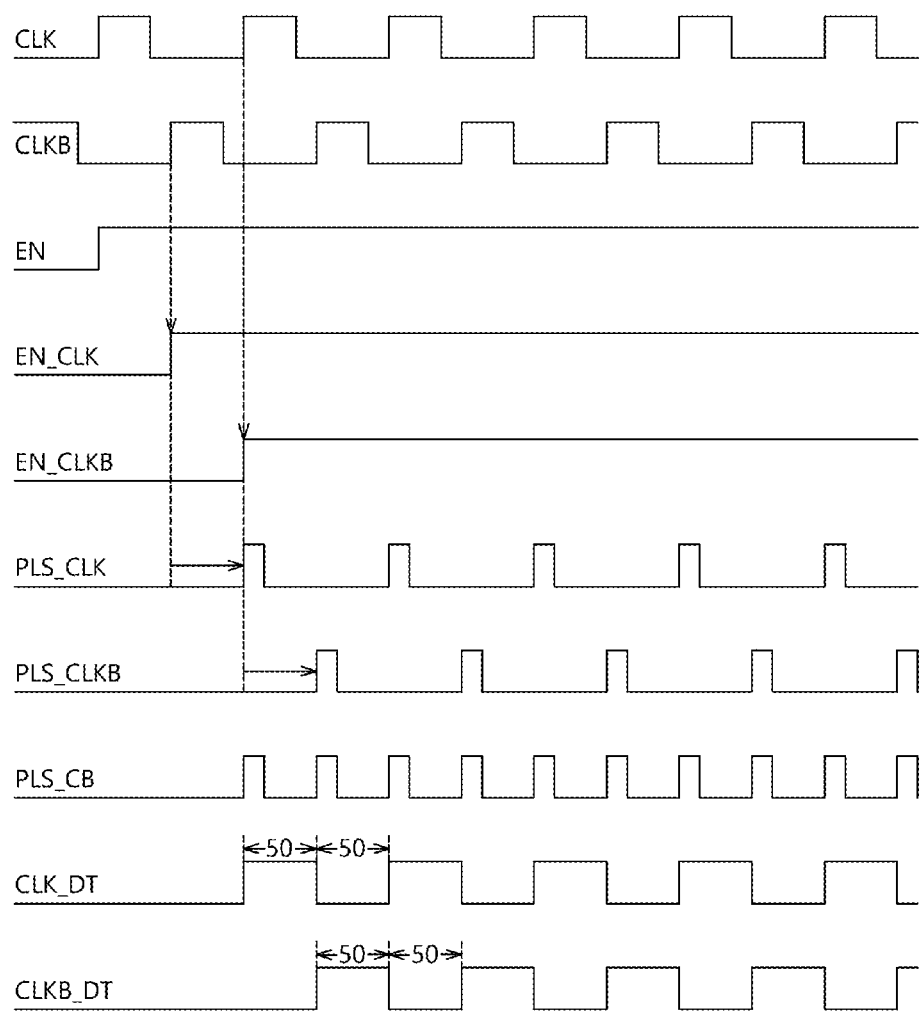
FIGS. 5 and 6 are timing diagrams for describing a duty correction operation according to an embodiment.

FIG. 5 illustrates a duty correction operation when a duty ratio difference of the first differential clock signal CLK, that is, a difference between a high-level period and a low-level period is equal to or less than 50% of the cycle of the first differential clock signal CLK. Referring to FIG. 5, the duty correction operation will be described, for example, as follows.

When the enable signal EN is activated to a high level, the duty correction circuit 100 may generate the first enable control signal EN_CLK by sampling the enable signal EN using the second differential clock signal CLKB, and generate the second enable control signal EN_CLKB by sampling the first enable control signal EN_CLK using the first differential clock signal CLK.

While the first enable control signal EN_CLK is activated to a high level, the duty correction circuit 100 may generate the first pre-duty correction control signal PLS_CLK having the rising edge information of the first differential clock signal CLK.

While the second enable control signal EN_CLKB is activated to a high level, the duty correction circuit 100 may generate the second pre-duty correction control signal PLS_CLKB having the rising edge information of the second differential clock signal CLKB.

The duty correction circuit 100 may perform an OR operation on the first pre-duty correction control signal PLS_CLK and the second pre-duty correction control signal PLS_CLKB, and generate the duty correction control signal PLS_CB.

The duty correction circuit 100 may change the first duty correction clock signal CLK_DT whenever a rising edge occurs from the first rising edge of the duty correction control signal PLS_CB, and change the second duty correction clock signal CLKB_DT whenever a rising edge occurs from the second rising edge of the duty correction control signal PLS_CB.

The first and second differential clock signals CLK and CLKB may have a phase difference corresponding to a half cycle of the first differential clock signal CLK.

Since the first pre-duty correction control signal PLS_CLK is generated based on rising edges of the first differential clock signal CLK and the second pre-duty correction control signal PLC_CLKB is generated based on rising edges of the second differential clock signal CLKB, the first and second pre-duty correction control signals PLS_CLK and PLS_CLKB may also have a phase difference corresponding to a half cycle of the first differential clock signal CLK.

Since the duty correction control signal PLC_CB is generated through an OR operation on the first and second pre-duty correction control signals PLS_CLK and PLS_CLKB, a pulse of the duty correction control signal PLS_CB may be generated at each half cycle of the first differential clock signal CLK.

Thus, the duty correction circuit 100 may generate the first and second duty correction clock signals CLK_DT and CLKB_DT having a constant duty ratio, that is, a duty ratio of 50:50.

Figure 6:
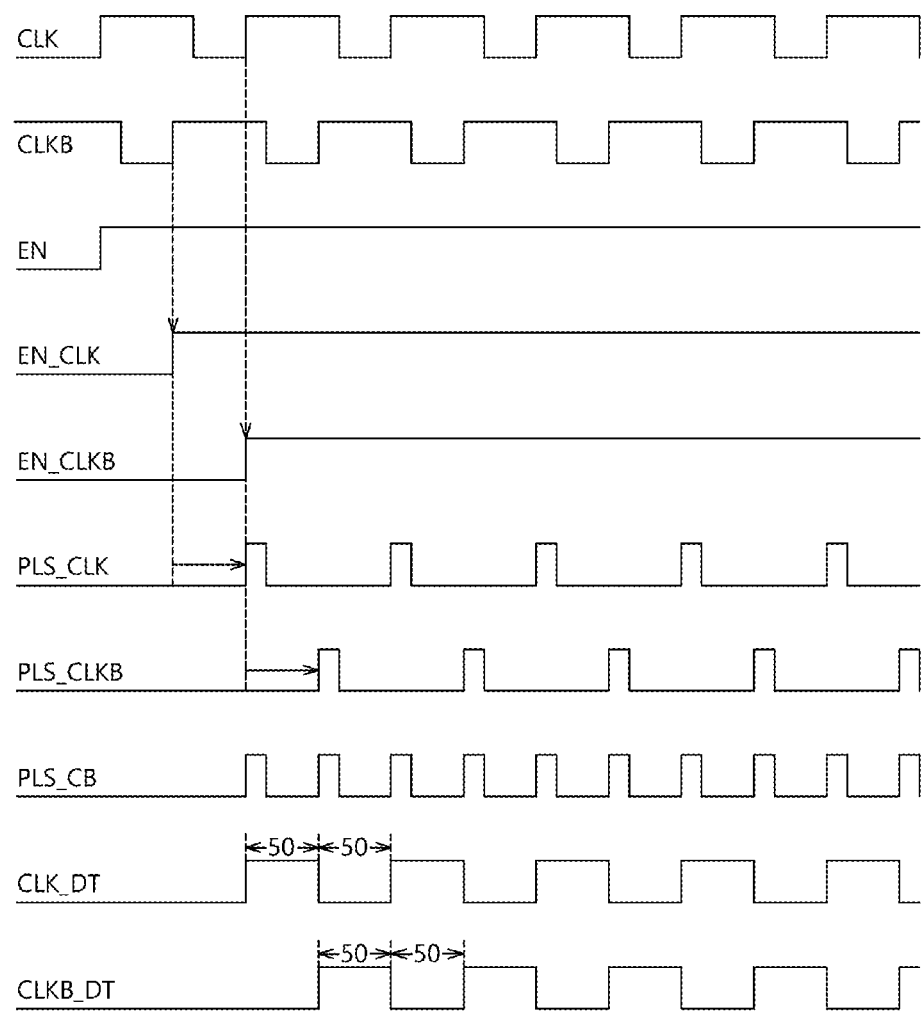
Figure 7:
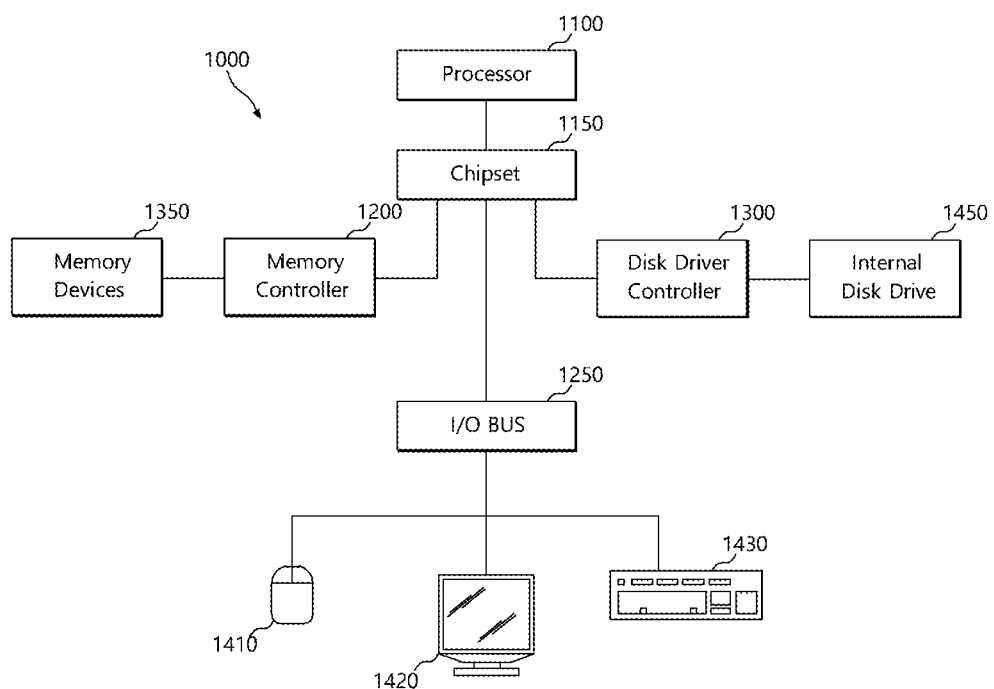
FIG. 7 illustrates a block diagram of an example of a representation of a system employing a duty correction circuit with the various embodiments discussed above with relation to FIGS. 1-6.

FIG. 6 is a timing diagram illustrating a duty correction operation when the duty ratio difference of the first differential clock signal CLK, that is, the difference between a high-level period and a low-level period is more than 50% of the cycle of the first differential clock signal CLK.

As described with reference to FIG. 5, the duty correction circuit 100 according to an embodiment may perform a duty correction operation regardless of a duty ratio difference between input signals, because the edge information of input signals which are exactly out of phase, that is, only the rising edge information is used. That is, the duty correction circuit 100 may have a wide duty correctable range.

The duty correction operation of FIG. 6 may be performed in the same manner as FIG. 5. As in FIG. 5, the duty correction circuit 100 may generate the first and second duty correction clock signals CLK_DT and CLKB_DT having a constant duty ratio, that is, a duty ratio of 50:50.

While certain embodiments have been described above, it will be understood to those skilled in the art that the embodiments described are by way of example only. Accordingly, the duty correction circuit described herein should not be limited based on the described embodiments. Rather, the duty correction circuit described herein should only be limited in light of the claims that follow when taken in conjunction with the above description and accompanying drawings.

What is claimed is:
1. A duty correction circuit comprising:
  a control circuit configured to generate a duty correction control signal by detecting edges of first differential clock signal and edges of second differential clock signal; and
  a duty correction clock signal generation circuit configured to generate a duty correction clock signal according to edges of the duty correction control signal,
  wherein the control circuit is configured to output first pulse signals generated in response to the edges of the first differential clock signal and second pulse signals generated in response to the edges of the second differential clock signal, as the duty correction control signal, and wherein the control circuit comprises:

a first edge detection circuit configured to generate the first pulse signals corresponding to rising edges of the first differential clock signal, and output the generated first pulse signals as a first pre-duty correction control signal;

a second edge detection circuit configured to generate the second pulse signals corresponding to rising edges of the second differential clock signal, and output the generated second pulse signals as a second pre-duty correction control signal; and a signal combination circuit configured to perform an OR operation on the first and second pre-duty correction control signals, and output the operation result as the duty correction control signal.

2. The duty correction circuit of claim 1, wherein the duty correction clock signal generation circuit is configured to generate the duty correction clock signal according to only rising edges of the duty correction control signal.

3. The duty correction circuit of claim 1, wherein the control circuit is configured to generate the duty correction control signal by detecting only rising edges of the first and the second differential clock signals.

4. The duty correction circuit of claim 1, wherein the duty correction clock signal generation circuit is configured to generate the duty correction clock signal having a constant duty ratio.

5. The duty correction circuit of claim 1, wherein the control circuit comprises:

a duty correction control signal generation circuit configured to generate first pulse signals corresponding to the edges of the first differential clock signal, generate second pulse signals corresponding to the edges of the second differential clock signal, perform a logic operation on the generated first pulse signals with the generated second pulse signals and output the operation result as the duty correction control signal.

6. The duty correction circuit of claim 1, wherein the duty correction clock signal generation circuit is configured to generate the duty correction clock signal by dividing a feedback signal obtained by feeding back the duty correction clock signal according to the duty correction control signal.

7. A duty correction circuit comprising:

a control circuit configured to generate a duty correction control signal by detecting edges of first and second differential clock signals according to an enable signal; and a duty correction clock signal generation circuit configured to generate a duty correction clock signal according to edges of the enable signal and the duty correction control signal.

8. The duty correction circuit of claim 7, wherein the control circuit comprises:

an enable control signal generation circuit configured to generate a first enable control signal by sampling the enable signal using the second differential clock signal, and generate a second enable control signal by sampling the first enable control signal using the first differential clock signal; and a duty correction control signal generation circuit configured to generate first pulse signals which correspond to an active period of the first enable control signal and the edges of the first differential clock signal, generate second pulse signals which correspond to an active period of the second enable control signal and the edges of the second differential clock signal, and output the generated pulse signals as the duty correction control signal.

9. The duty correction circuit of claim 8, wherein the enable control signal generation circuit comprises:

a first flip-flop configured to sample the enable signal using the second differential clock signal and output the sampled signal as the first enable control signal; and a second flip-flop configured to sample the first enable control signal using the first differential clock signal and output the sampled signal as the second enable control signal.

10. The duty correction circuit of claim 8, wherein the duty correction control signal generation circuit comprises:

a first edge detection circuit configured to generate the first pulse signals which correspond to an active period of the first enable control signal and the edges of the first differential clock signal, and output the generated first pulse signals as a first pre-duty correction control signal;

a second edge detection circuit configured to generate the second pulse signals which correspond to an active period of the second enable control signal and the edges of the second differential clock signal, and output the generated second pulse signals as a second pre-duty correction control signal; and a signal combination circuit configured to perform a logic operation on the first and second pre-duty correction control signals and output the operation result as the duty correction control signal.

11. The duty correction circuit of claim 7, wherein the duty correction control signal generation circuit is configured to generate a first duty correction clock signal by dividing a first feedback signal based on a first timing of the duty correction control signal, and generate a second duty correction clock signal by dividing a second feedback signal based on a second timing of the duty correction control signal.

12. The duty correction circuit of claim 11, wherein the duty correction clock signal generation circuit is configured to change the first duty correction clock signal whenever an edge occurs from the first edge of the duty correction control signal, and change the second duty correction clock signal whenever an edge occurs from the second edge of the duty correction control signal.

13. The duty correction circuit of claim 7, wherein the duty correction clock signal generation circuit comprises:

a first divider configured to output a signal obtained by latching a first feedback signal as the first duty correction clock signal according to an edge of the duty correction control signal when the enable signal is activated, and generate the first feedback signal by inverting the first duty correction clock signal;

a timing controller configured to generate a shift signal by shifting the enable signal based on an edge of the duty correction control signal; and a second divider configured to output a signal obtained by latching a second feedback signal as the second duty correction clock signal according to an edge of the duty correction control signal when the shift signal is activated, and generate the second feedback signal by inverting the second duty correction clock signal.

14. A duty correction circuit comprising:

an enable control signal generation circuit configured to generate a first enable control signal by sampling an enable signal using a second differential clock signal, and generate a second enable control signal by sampling the first enable control signal using a first differential clock signal;
a duty correction control signal generation circuit configured to generate first pulse signals which correspond to an active period of the first enable control signal and edges of the first differential clock signal, generate second pulse signals which correspond to an active period of the second enable control signal and edges of the second differential clock signal, and output the generated pulse signals as a duty correction control signal; and
a duty correction clock signal generation circuit configured to generate a first duty correction clock signal by dividing a first feedback signal based on a first timing of the duty correction control signal, and generate a second duty correction clock signal by dividing a second feedback signal based on a second timing of the duty correction control signal.

15. The duty correction circuit of claim 14, wherein the enable control signal generation circuit comprises:
a first flip-flop configured to sample the enable signal using the second differential clock signal and output the sampled signal as the first enable control signal; and
a second flip-flop configured to sample the first enable control signal using the first differential clock signal and output the sampled signal as the second enable control signal.

16. The duty correction circuit of claim 14, wherein the duty correction control signal generation circuit comprises:
a first edge detection circuit configured to generate the first pulse signals which correspond to an active period of the first enable control signal and the edges of the first differential clock signal, and output the generated first pulse signals as a first pre-duty correction control signal;
a second edge detection circuit configured to generate the second pulse signals which correspond to an active period of the second enable control signal and the edges of the second differential clock signal, and output the generated second pulse signals as a second pre-duty correction control signal; and
a signal combination circuit configured to perform a logic operation on the first and second pre-duty correction control signals and output the operation result as the duty correction control signal.

17. The duty correction circuit of claim 14, wherein the duty correction clock signal generation circuit is configured to change the first duty correction clock signal whenever an edge occurs from the first edge of the duty correction control signal, and change the second duty correction clock signal whenever an edge occurs from the second edge of the duty correction control signal.

18. The duty correction circuit of claim 14, wherein the duty correction clock signal generation circuit comprises:
a first divider configured to output a signal obtained by latching the first feedback signal as the first duty correction clock signal according to an edge of the correction control signal when the enable signal is activated, and generate the first feedback signal by inverting the first duty correction clock signal;
a timing controller configured to generate a shift signal by shifting the enable signal based on an edge of the duty correction control signal; and
a second divider configured to output a signal obtained by latching the second feedback signal as the second duty correction signal according to an edge of the duty correction control signal when the shift signal is activated, and generate the second feedback signal by inverting the second duty correction clock signal.

* * * * *